(12) United States Patent
Miura et al.

(10) Patent No.: US 11,702,739 B2
(45) Date of Patent: Jul. 18, 2023

(54) FILM DEPOSITION METHOD AND FILM DEPOSITION APPARATUS

(71) Applicant: Tokyo Electron Limited, Tokyo (JP)

(72) Inventors: Hiroki Miura, Iwate (JP); Masato Koakutsu, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 293 days.

(21) Appl. No.: 16/285,352

(22) Filed: Feb. 26, 2019

(65) Prior Publication Data

US 2019/0271077 A1   Sep. 5, 2019

(30) Foreign Application Priority Data

Mar. 2, 2018 (JP) .................. 2018-038039

(51) Int. Cl.
| | |
|---|---|
| *C23C 16/44* | (2006.01) |
| *H01L 21/687* | (2006.01) |
| *C23C 16/455* | (2006.01) |
| *C23C 16/52* | (2006.01) |
| *H01L 21/677* | (2006.01) |

(52) U.S. Cl.
CPC ...... *C23C 16/4405* (2013.01); *C23C 16/4408* (2013.01); *C23C 16/4412* (2013.01); *C23C 16/45565* (2013.01); *C23C 16/52* (2013.01); *H01L 21/67748* (2013.01); *H01L 21/68764* (2013.01); *H01L 21/68771* (2013.01)

(58) Field of Classification Search
None
See application file for complete search history.

(56) References Cited

U.S. PATENT DOCUMENTS

| | | | | |
|---|---|---|---|---|
| 2004/0002220 | A1* | 1/2004 | Mizushima | ......... C23C 16/4412 438/706 |
| 2010/0122710 | A1* | 5/2010 | Kato | ................. H01L 21/67028 134/1 |
| 2014/0011370 | A1* | 1/2014 | Kato | ................. H01J 37/32449 438/782 |
| 2014/0345523 | A1* | 11/2014 | Kikuchi | ................. C23C 16/52 118/712 |
| 2016/0379868 | A1* | 12/2016 | Sato | ................. H01L 21/76802 438/703 |

FOREIGN PATENT DOCUMENTS

| | | |
|---|---|---|
| JP | 2010-153805 | 7/2010 |
| JP | 2016-042561 | 3/2016 |
| KR | 10-2014-0005818 | 1/2014 |
| KR | 10-2017-0000351 | 1/2017 |

\* cited by examiner

*Primary Examiner* — Joel G Horning
(74) *Attorney, Agent, or Firm* — IPUSA, PLLC

(57) ABSTRACT

A film deposition method uses a film deposition apparatus including a source gas supply part and a cleaning gas supply part. In the method, a source gas is adsorbed on a substrate by supplying the source gas from the source gas supply part without supplying a purge gas into the cleaning gas supply part. A reaction product is deposited on the substrate by supplying a reaction gas reactable with the source gas to the substrate on which the source gas is adsorbed without supplying the purge gas into the cleaning gas supply part.

12 Claims, 11 Drawing Sheets

FIG.11

| SEQUENCE / STEP NUMBER | | S1 | S2 | S3 | S4 | S5 | S6 | S7 | S8 | S9 | ... | Sn-3 | Sn-2 | Sn-1 | n |
|---|---|---|---|---|---|---|---|---|---|---|---|---|---|---|---|
| CLEANING LINE PURGE | | | PART OR ALL IN RANGE | | PART OR ALL IN RANGE | | PART OR ALL IN RANGE | | PART OR ALL IN RANGE | | ... | | | PART OR ALL IN RANGE | |
| FILM DEPOSITION RECIPE | PRE-DEPOSITION TREATMENT PROCESS | | ↑ | ↑ | | | ↑ | | | | ... | ↑ | | | |
| | DEPOSITION | | | | ↑ | | | ↑ | | | ... | | ↑ | | |
| | POST-DEPOSITION TREATMENT PROCESS | | | | | | | | ↑ | | ... | | | ↑ | |
| WAFER TRANSFER | CARRY-IN | ↑ | | | | | | | | | ... | | | | |
| | REPLACEMENT | | | | | ↑ | | | | ↑ | ... | | | | |
| | CARRY-OUT | | | | | | | | | | ... | | | | ↑ |

FIG.12

| SEQUENCE / STEP NUMBER | | S1 | S2 | S3 | S4 | S5 | S6 | S7 | S8 | S9 | S10 | S11 | S12 |
|---|---|---|---|---|---|---|---|---|---|---|---|---|---|
| CLEANING LINE PURGE | | | | | | | ↑ | | | | | | ↑ |
| FILM DEPOSITION RECIPE | PRE-DEPOSITION TREATMENT PROCESS | | ↑ | | | | | | ↑ | | | | |
| | DEPOSITION | | | ↑ | | | | | | ↑ | | | |
| | POST-DEPOSITION TREATMENT PROCESS | | | | ↑ | | | | | | ↑ | | |
| WAFER TRANSFER | CARRY-IN | ↑ | | | | | | ↑ | | | | | |
| | CARRY-OUT | | | | | ↑ | | | | | | ↑ | |

FILM DEPOSITION METHOD AND FILM DEPOSITION APPARATUS

CROSS-REFERENCE TO RELATED APPLICATION

The present application is based on and claims priority to Japanese Priority Application No. 2018-038039 filed on Mar. 2, 2018, the entire contents of which are hereby incorporated herein by reference.

BACKGROUND OF THE INVENTION

1. Field of the Invention

The present disclosure relates to a film deposition method and film deposition apparatus.

2. Description of the Related Art

Conventionally, as described in Japanese Laid-Open Patent Application Publication No. 2010-153805, a cleaning method is known that includes steps of rotating a susceptor disposed in a chamber and including a substrate receiving region on which a substrate is placed, supplying a cleaning gas from a gas nozzle extending along a surface of the susceptor to a concave space partitioned by a first concave-shaped member that opens toward a surface of the susceptor and is disposed above the susceptor, and evacuating the cleaning gas through a gas flow passage formed between the first concave-shaped member and a second concave-shaped member covering the first concave-shaped member.

In Japanese Laid-Open Patent Application Publication No. 2010-153805, when a film is deposited using a film deposition apparatus, $N_2$ gas or an inert gas is supplied from a gas nozzle, and $N_2$ gas is evacuated through the gas flow passage and an exhaust pipe, thereby preventing the cleaning gas from mixing with a reaction gas. Thus, although the cleaning gas used for cleaning the film deposition apparatus is supplied from a gas supply unit such as a gas nozzle provided in the chamber, a purge gas is supplied to the gas nozzle to prevent the gas from flowing back during the film deposition into which the cleaning gas is not supplied.

However, a gas nozzle for cleaning gas supply is frequently disposed near a source gas nozzle in terms of efficiently cleaning the source gas nozzle and a member around the source gas nozzle, and when a purge gas such as $N_2$ gas is supplied from the gas nozzle for cleaning gas supply during the film deposition, uniformity of film deposition may be negatively affected, and quality of a thin film is liable to degrade. Moreover, the gas nozzle for cleaning gas supply sometimes has approximately the same length as that of the source gas in terms of uniformly cleaning the entire surface of the susceptor. In such a case, even if the cleaning gas nozzle is not disposed near the source gas nozzle, supply of the purge gas during the film deposition may negatively affect the uniformity of film deposition.

SUMMARY OF THE INVENTION

The present disclosure is made in light of the above problems, and provides a film deposition method and a film deposition apparatus that can reduce generation of a particle without impairing uniformity of film deposition.

According to an embodiment, there is provided a film deposition method using a film deposition apparatus including a source gas supply part and a cleaning gas supply part. In the method, a source gas is adsorbed on a substrate by supplying the source gas from the source gas supply part without supplying a purge gas into the cleaning gas supply part. A reaction product is deposited on the substrate by supplying a reaction gas reactable with the source gas to the substrate on which the source gas is adsorbed without supplying the purge gas into the cleaning gas supply part.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 11 is a diagram illustrating a first sequence of a film deposition method according to an embodiment of the present disclosure; and FIG. 12 is a diagram illustrating a second sequence of a film deposition method according to an embodiment of the present disclosure.

DETAILED DESCRIPTION OF THE PREFERRED EMBODIMENTS

Embodiments of the present disclosure are described below with reference to accompanying drawings.

[Film Deposition Apparatus]

Figure 1:
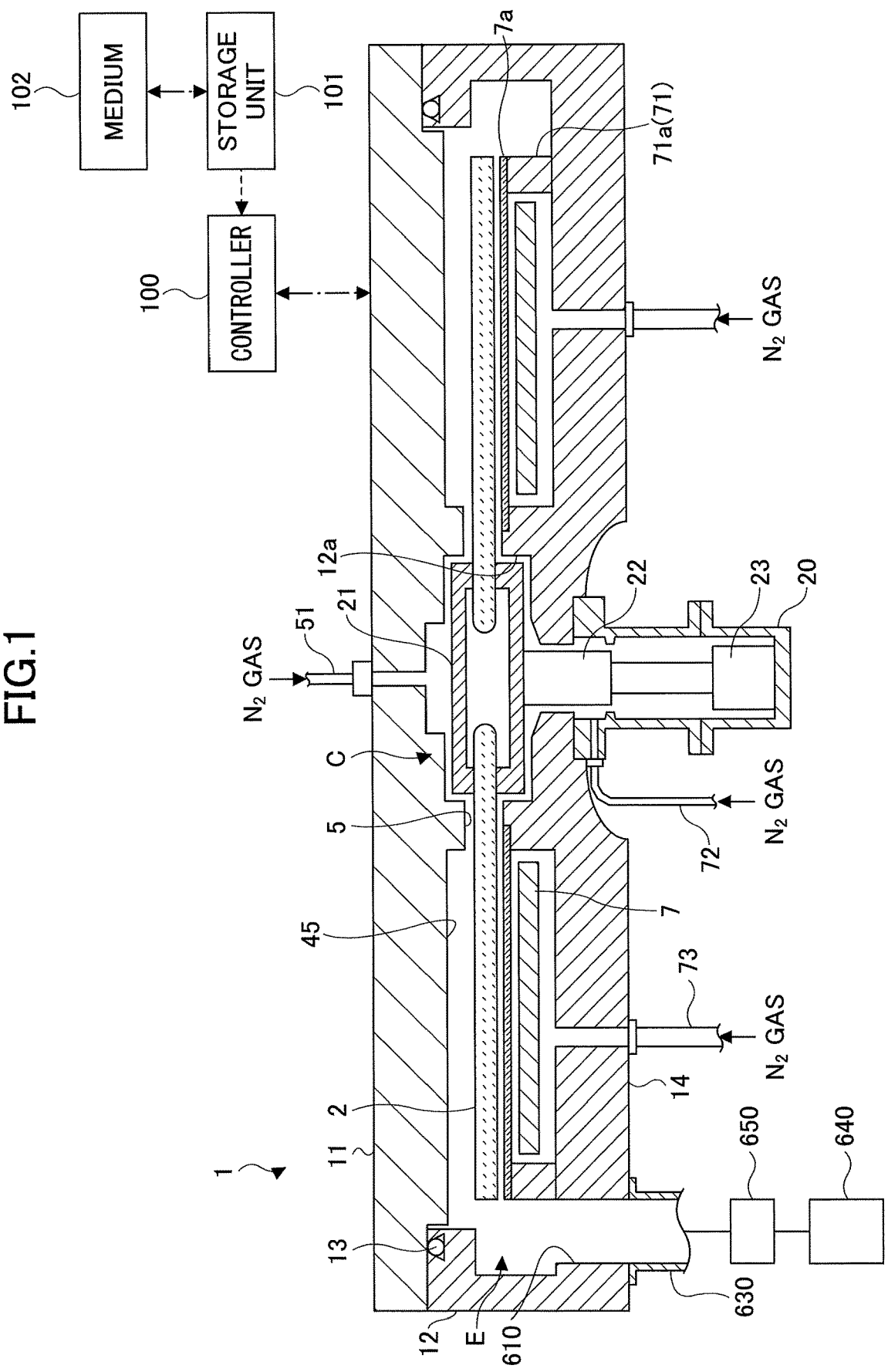
FIG. 1 a schematic cross-sectional view illustrating a film deposition apparatus according to an embodiment of the present disclosure.
Figure 2:
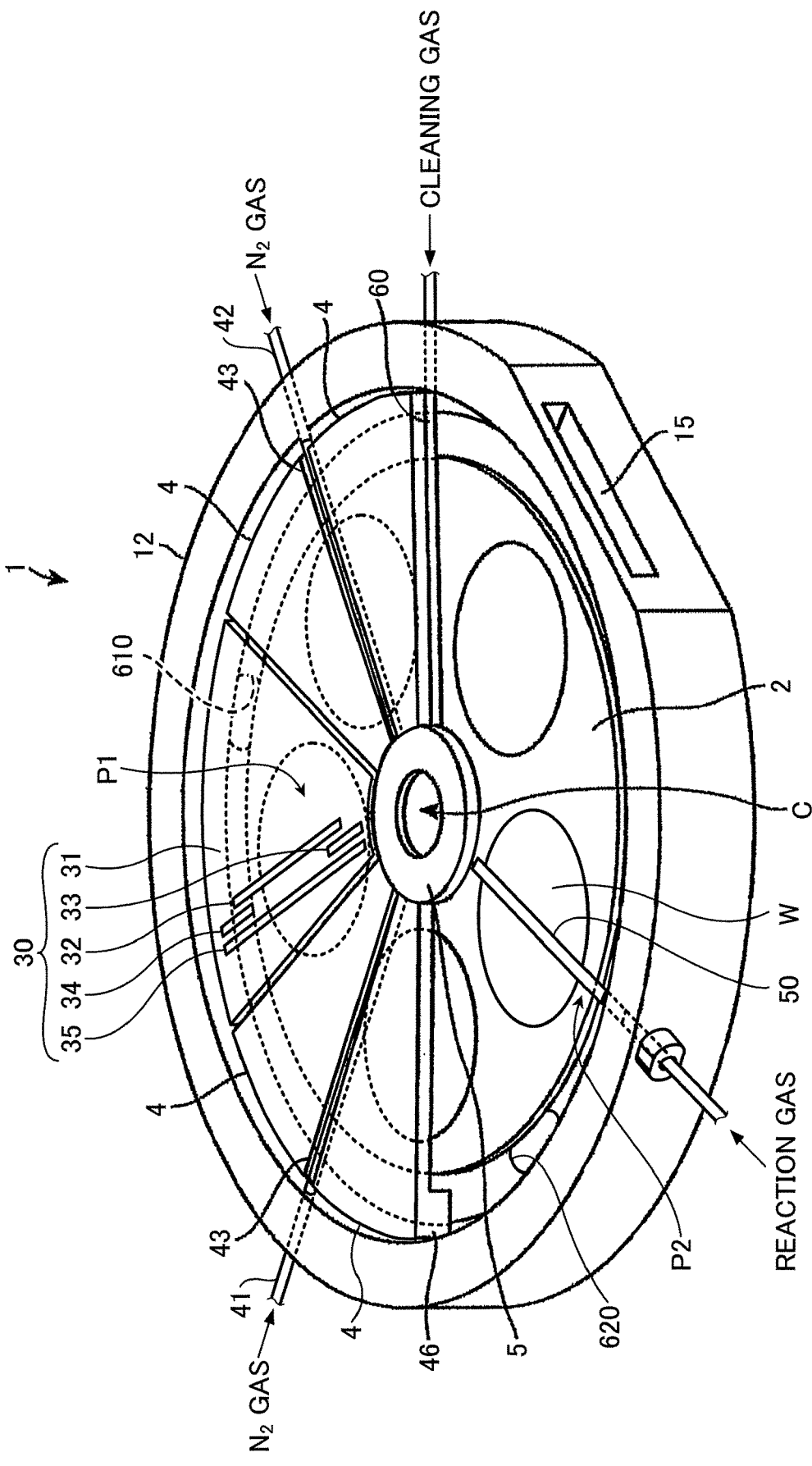
FIG. 2 is a schematic perspective view illustrating an inside structure of a vacuum chamber of a film deposition apparatus according to an embodiment of the present disclosure.
Figure 3:
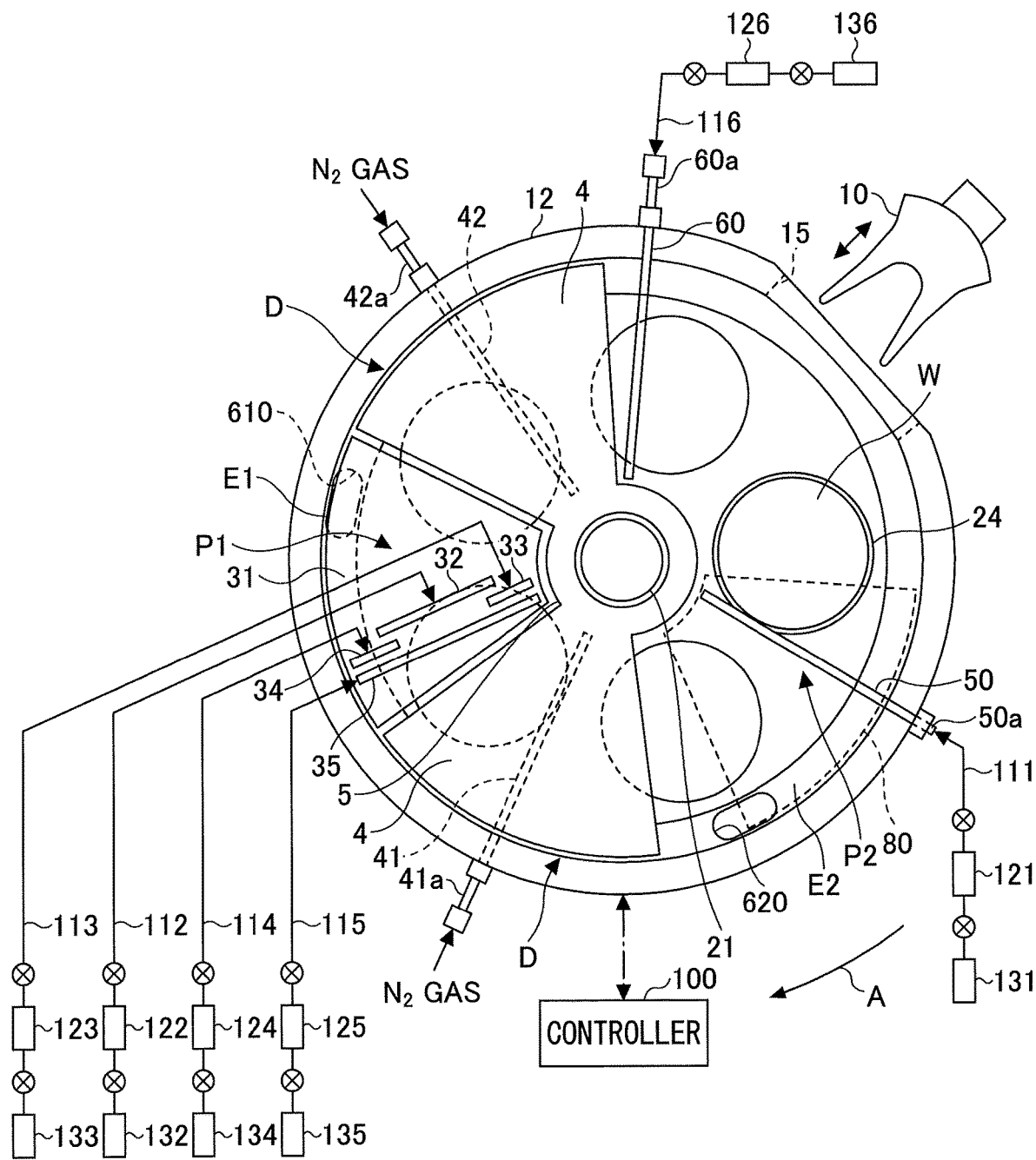
FIG. 3 is a schematic plan view illustrating an example of a vacuum chamber of a film deposition apparatus according to an embodiment of the present disclosure.

To begin with, a film deposition apparatus according to an embodiment of the present disclosure is described below. With reference to FIGS. 1 through 3, the film deposition apparatus includes a vacuum chamber 1 having a substantially flat circular shape, and a turntable 2 having a rotational axis coincident with the center of the vacuum chamber 1. The vacuum chamber 1 is a process chamber to contain a wafer therein and to perform a film deposition process on a surface of the wafer. The vacuum chamber 1 includes a chamber body 12 having a cylindrical shape with a bottom surface, and a ceiling plate 11 placed on the upper surface of the chamber body 12. The ceiling plate 11 is detachably placed on the chamber body 12 via a sealing member 13 (FIG. 1) such as an O-ring in an airtight manner.

The turntable 2 is provided in the vacuum chamber 1. The turntable 2 is attached to a cylindrical shaped core unit 21 at its center portion. The core unit 21 is fixed to the upper end of a rotary shaft 22 that extends in the vertical direction. The rotary shaft 22 is provided to penetrate the bottom portion 14 of the vacuum chamber 1 and its lower end is attached to a driving unit 23 that rotates the rotary shaft 22 (FIG. 1) about a vertical axis. The rotary shaft 22 and the driving unit 23 are housed in the cylindrical case body 20 whose upper surface is open. The case body 20 is attached to a lower surface of the bottom portion 14 of the vacuum chamber 1 via a flange portion provided at its upper surface in an airtight manner so that inner atmosphere of the case body 20 is isolated from outside atmosphere.

As illustrated in FIGS. 2 and 3, a plurality of (five in the example of the drawing) circular concave portions 24 is provided at a top surface of the turntable 2 along a rotational direction (circumferential direction) to receive the plurality of semiconductor wafers (which will be referred to as "wafers" hereinafter) W, respectively. In FIG. 3, only a single wafer W is illustrated in one of the concave portions 24 for an explanatory purpose. Each of the concave portions 24 is formed to have a slightly larger (for example, 4 mm larger) diameter than that of the wafer W, and a depth substantially equal to the thickness of the wafer W. Thus, when the wafer W is placed in the respective concave portion 24, the surface of the wafer W and the surface of the turntable 2 (where the wafer W is not placed) become almost the same height. Each of the concave portions 24 has three, for example, through holes formed in the bottom, through which lift pins for supporting a back surface of the respective wafer W and lifting the wafer W penetrate (both of which are not illustrated in the drawings).

FIGS. 2 and 3 are diagrams for explaining an inside structure of the vacuum chamber 1. The ceiling plate 11 is not illustrated in FIG. 2 and FIG. 3 for an explanatory purpose. As illustrated in FIGS. 2 and 3, a bottom plate 31 of a showerhead 30 that serves as a source gas supply region P1, a cleaning gas nozzle 60, a reaction gas nozzle 50, separation gas nozzles 41 and 42, each of which is made of quartz, for example, is provided above the turntable 2. In the example illustrated in FIG. 3, the reaction gas nozzle 50, the separation gas nozzle 41, the bottom plate 31, the separation gas nozzle 42, and the cleaning gas nozzle 60 are arranged in this order from a transfer port 15 (which will be explained later) in a clockwise direction (the rotational direction of the turntable 2 as illustrated by an arrow A in FIG. 3) with a space therebetween in a circumferential direction of the vacuum chamber 1. The bottom plate 31 of the showerhead 30 includes a main source gas supply part 32, an axial-side source gas supply part 33, and a peripheral-side source gas supply part 34 formed therein. The main source gas supply part 32, the axial-side source gas supply part 33, and the peripheral-side source gas supply part 34 are gas supply units to supply a source gas (precursor). Each bottom surface of the main source gas supply part 32, the axial-side source gas supply part 33, and the peripheral-side source gas supply part 34 has a plurality of gas holes (which are not illustrated in the drawings), and supplies the source gas and the source gas along a radial direction of the turntable 2. The main source gas supply part 32 extends along the radial direction of the turntable 2 throughout the radius so as to cover a principal part of the wafer W including the center. On the other hand, the axial-side source gas supply part 33 extends only in a predetermined region that has about ¼ of the main source gas supply part 32 on the axial side of the turntable 2. The peripheral-side source gas supply part 34 extends only in a predetermined region that has about ¼ of the main source gas supply part 32 on the peripheral-side of the turntable 2. Any of the gas supply parts 32 to 34 is arranged along the radial direction of the turntable 2. Then, the source gas supply parts 32 to 34 totally cover substantially the entire radius of the turntable 2 including the concave portion 24. Here, in the present embodiment, although the source gas supply parts 32 to 34 are divided into three parts of the axial side, the center, and the peripheral side, as long as the source gas supply parts 32 to 34 can cover approximately the whole of the radius of the turntable 2, the source gas supply parts 32 to 34 may be formed into a single linear shape, or may be formed into two divisional parts. Hereinafter, the main source gas supply part 32, the axial-side source gas supply part 33 and the peripheral-side source gas supply part 34 may be referred to as the source gas supply parts 32 to 34.

In the present embodiment, the axial-side source gas supply part 33 and the peripheral-side source gas supply part 34 are configured to supply a source gas for film thickness adjustment that can enhance the uniformity across the surface of the wafer W without preventing a flow of the source gas supplied from the main source gas supply part 32, but such a configuration is not essential, and the source gas supply parts 32 to 34 can be configured depending on the intended use.

Gas introduction ports 50a, 60a, 41a, and 42a (FIG. 3) that are base portions of the gas nozzles 50, 60, 41, and 42, respectively, are fixed to an outer peripheral wall of the chamber body 12 so that these nozzles 50, 60, 41, and 42 are introduced into the vacuum chamber 1 from the outer peripheral wall of the vacuum chamber 1 so as to extend in a radial direction and parallel to the surface of the turntable 2.

In contrast, because the main source gas supply part 32, the axial-side source gas supply part 33 and the peripheral-side source gas supply part 34 are provided in the bottom plate 31 of the showerhead 30, the source gas introduced in the showerhead 30 are introduced into the vacuum chamber 1 through the main source gas supply part 32, the axial-side source gas supply part 33 and the peripheral-side source gas supply part 34.

In the present embodiment, as illustrated in FIG. 3, the main source gas supply part 32 is connected to a supply source 132 (not illustrated in the drawings) of a source gas via a pipe 112, a flow controller 122 and the like (not illustrated in the drawings). The axial-side source gas supply part 33 is connected to a supply source 133 (not illustrated in the drawings) of an axial-side source gas via a pipe 113, a flow controller 123 and the like. Moreover, the peripheral-side source gas supply part 34 is connected to a supply source 134 of a peripheral-side source gas via a pipe 114, a flow controller 124 and the like. Here, the source gas is, for example, a silicon-containing gas such as an organic aminosilane gas, a titanium-containing gas such as TiCl$_4$ and the like. The axial-side source gas and the peripheral-side source gas may be, for example, a noble gas such as Ar or an inert gas such as nitrogen gas, the same gas as the source gas, a mixed gas of these, or another type of gas. A preferable gas to enhance the uniformity across the wafer, for example, a gas intended to adjust a film thickness, is properly selected and used as the source gas depending on the intended use and process.

In FIG. 3, the supply sources 132 to 134 are connected to the main source gas supply part 32, the axial-side source gas supply part 33 and the peripheral-side source gas supply part 34 on a one-to-one basis, respectively. In the meantime, when supplying a mixed gas, by adding pipes and connecting supply passages with each other, the supply passages may be configured to finally and individually supply mixed gases at an appropriate mix proportion to the main source gas supply part 32, the axial-side source gas supply part 33 and the peripheral-side source gas supply part 34. In other words, when mixed gases containing the same gas are supplied to the main source gas supply part 32 and the peripheral-side source gas supply part 33, respectively, final mixed gases may be individually supplied to the main source gas supply part 32 and the peripheral-side source gas supply part 33 by introducing the same gas from the common gas supply sources 130 to 132. As long as the gases are finally supplied to the main source gas supply part 32, the axial-side source gas supply part 33 and the peripheral-side source gas supply part 34 individually, the connecting configuration of the gas supply passages is not limited to a specific configuration. Moreover, when a single source gas supply part is configured without providing three divided source gas supply parts, the source gas supply source 132 to 134 and the flow controller 122 to 124 may be united and made a single.

Furthermore, a cleaning gas supply part 35 is connected to a supply source 135 of a reaction gas via a pipe 115 and a flow controller 125. The cleaning gas is a gas that can remove a thin film deposited on the surface of the turntable 2. For example, a variety of cleaning gases including a fluorine-containing gas such as ClF$_3$, CF$_4$, C$_2$F$_6$, C$_3$F$_8$, CHF$_3$, NF$_3$, and F$_2$ may be used.

The reaction gas nozzle 50 is connected to a supply source 131 of a reaction gas via a pipe 111 and a flow controller 121. The reaction gas is a gas that can generate a reaction product by reacting with the source gas, and for example, an oxidation gas such as O$_3$ for a silicon-containing gas, a nitriding gas such as NH$_3$ for a titanium-containing gas and the like are available. In other words, the oxidation gas such as O$_2$, O$_3$, H$_2$O, and H$_2$O$_2$ are used to deposit an oxide film, and a nitriding gas such as NH$_3$ may be used to deposit a nitride film.

As necessary, an ICP (Inductively-Coupled Plasma) type plasma generator is provided above the reaction gas nozzle 50, and activated oxygen or ammonia may be supplied to the wafer W. For example, an ICP plasma generator may be provided in a region illustrated by a broken line 80 on the ceiling plate 11 of the vacuum chamber 1. In this case, oxygen is used as the oxidation gas, and nitrogen may be used as the nitriding gas in addition to ammonia.

The cleaning gas nozzle 60 is connected to a supply source 136 of the cleaning gas via a pipe 116, a flow controller 126 and the like. The cleaning gas supplied from the cleaning gas nozzle 60 is the same as the cleaning gas supplied from the cleaning gas supply part 35 as a rule. As discussed above, for example, a variety of cleaning gases including a fluorine-containing gas such as ClF$_3$, CF$_4$, C$_2$F$_6$, C$_3$F$_8$, CHF$_3$, NF$_3$ and F$_2$ can be used.

Moreover, the reaction gas nozzle 50 and the cleaning gas nozzle 60 may be configured as a showerhead as necessary. For example, a showerhead may be provided in a region illustrated by the broken line 80. Thus, a configuration and a supply form of a gas supply part can take a variety of forms depending on the intended use.

The separation gas nozzles 41 and 42 are connected to supply sources (not illustrated in the drawings) of a separation gas via pipes and flow controller valves and the like, respectively. A noble gas such as helium (He) or argon (Ar) or inert gas such as nitrogen (N$_2$) gas can be used as the separation gas. The present embodiment is described by citing an example of using Ar gas as the separation gas.

Each of the reaction gas nozzle 50 and the cleaning gas nozzle 60 has a plurality of gas discharge holes that faces downward to the turntable 2 along the longitudinal directions of each of the process gas nozzles 60 and 61 at intervals of 10 mm, for example. A region below the bottom plate 31 of the showerhead 30 is a first process region P1 in which the source gas is adsorbed on the wafers W. A region below the reaction gas nozzle 50 is a second process region P2 in which a reaction gas that reacts with the source gas adsorbed on the wafer W is supplied, thereby producing a molecular layer of a reaction product. The molecular layer of the reaction product constitutes a film to be deposited. Here, because the first process region P1 is a region where the source gas adsorbs, the first process region P1 may be referred to as an adsorption region P1. Similarly, because the second process region P2 is a region where the reaction gas reactable with the source gas and capable of producing the reaction product is supplied, the second process region P2 may be referred to as a reaction region P2.

Referring to FIGS. 2 and 3, the ceiling plate 11 includes two convex portions 4 protruding in the vacuum chamber 1. As will be explained later, the protruding portions are attached to a lower surface of the ceiling plate 11 so as to protrude toward the turntable 2 to form separation regions D with the corresponding separation gas nozzles 41 and 42. Each of the convex portions 4 has substantially a fan-like top view shape where the apex is removed in an arc shape. For each of the convex portions 4, the inner arc shaped portion is connected to a protruding portion 5 (which will be explained later) and the outer arc shaped portion is formed to extend along an inner peripheral surface of the chamber body 12 of the vacuum chamber 1.

Figure 4:
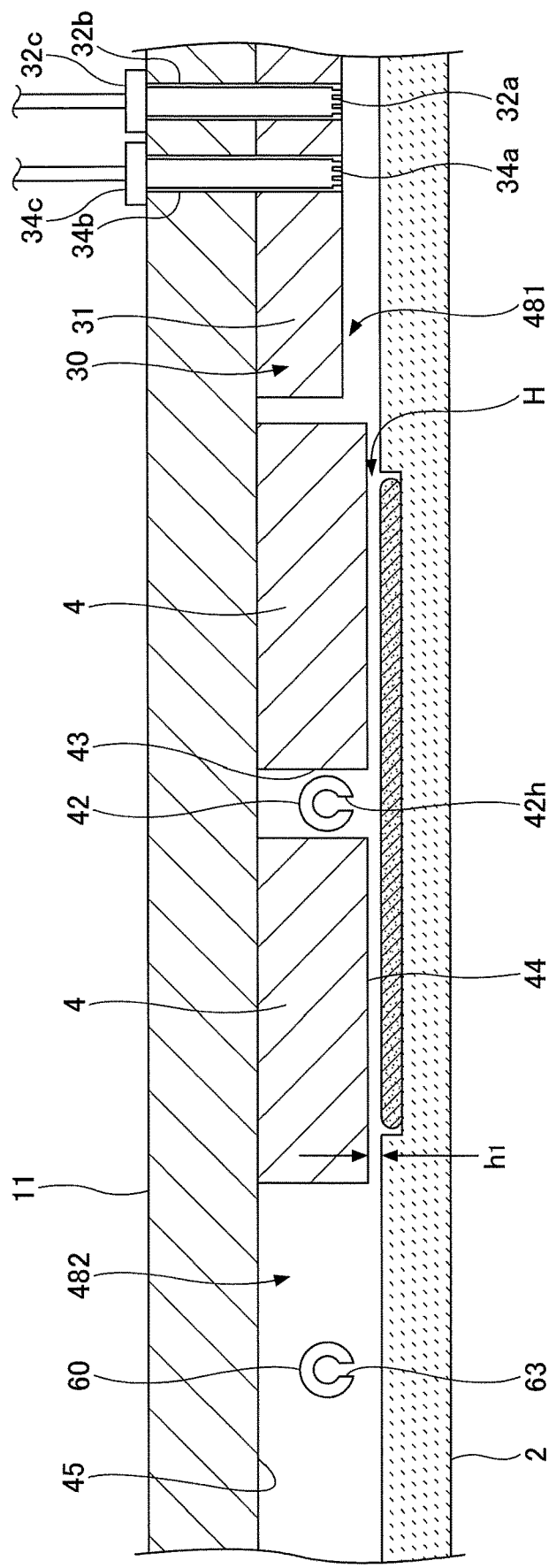
FIG. 4 is a schematic partial cross-sectional view of a film deposition apparatus according to an embodiment of the present disclosure.

FIG. 4 illustrates a cross-section of the vacuum chamber 1 along a concentric circle of the turntable 2 from the bottom plate 31 of the showerhead 30 to the cleaning gas nozzle 60. As illustrated in FIG. 4, the convex portion 4 is fixed to the lower surface of the ceiling plate 11. Thus, there are provided a flat low ceiling surface 44 (first ceiling surface) formed as the lower surface of the convex portion 4 and flat higher ceiling surfaces 45 (second ceiling surfaces) which are higher than the low ceiling surface 44 and formed on both sides of the low ceiling surface 44 in the circumferential direction. The low ceiling surface 44 has substantially a fan-like top view shape where the apex is removed in an arc shape. Furthermore, as illustrated in the drawings, the convex portion 4 includes a groove portion 43 at the center in the circumferential direction. The groove portion 43 is formed to extend in the radial direction of the turntable 2. The separation gas nozzle 42 is housed in the groove portion 43. Although not illustrated in FIG. 4, the separation gas nozzle 41 is also housed in a groove portion provided in the other convex portion 4. The bottom plate 31 of the showerhead 30 and the cleaning gas nozzle 60 are provided in spaces below the high ceiling surfaces 45, respectively. The cleaning gas nozzle 60 is provided in the vicinity of the wafers W apart from the high ceiling surfaces 45. Here, as illustrated in FIG. 4, the bottom plate 31 is provided in a space 481 below the high ceiling surface 45 on the right side, and the cleaning gas nozzle 60 is provided in a space 482 below the high ceiling surface 45 on the left side.

Each of the separation gas nozzles 41 and 42 has a plurality of gas discharge holes 42h (see FIG. 4) formed along the longitudinal direction thereof at a predetermined interval (10 mm, for example).

Also, the cleaning gas nozzle 60 has a plurality of gas discharge holes 63 formed along the longitudinal direction thereof at a predetermined interval (10 mm, for example).

The main source gas supply part 32, the axial-side source gas supply part 33 and the peripheral-side source gas supply part 34 provided in the bottom plate 31 of the showerhead 30 have gas discharge holes 32a, 33a and 34a, respectively (not illustrated in FIG. 4). As illustrated in FIG. 4, the gas discharge holes 32a of the main source gas supply part 32 and the gas discharge holes 34a of the main source gas supply part 34 are provided almost as high as the gas discharge holes 64 and 42h of the cleaning gas nozzle 60 and the separation gas nozzle 42. In the meantime, the height of the gas discharge holes 32a of the main source gas supply part 32 and the height of the gas discharge holes 34a of the peripheral-side source gas supply part 34 may differ from each other, and the source gas supply parts 32 to 34 may be formed into a variety of shapes depending on the intended use. Here, the gas discharge holes 32a of the main source gas supply part 32 are connected to a gas introduction part 32c provided in the upper surface of the ceiling plate 11 via a gas introduction port 32b. Similarly, the gas discharge holes 34a of the peripheral-side source gas supply part 34 are connected to a gas introduction part 34c provided in the upper surface of the top plate 11 via a gas introduction port 34b.

The low ceiling surface 44 provides a separation space H, which is a narrow space, with respect to the turntable 2. When $N_2$ gas is supplied from the separation gas nozzle 42 to the separation space H, this $N_2$ gas flows toward the space 481 and the space 482 through the separation space H. On this occasion, because the volume of the separation space H is smaller than those of the spaces 481 and 482, the pressure in the separation space H can be made higher than those in the spaces 481 and 482 by $N_2$ gas. It means that the separation space H having the higher pressure is formed between the spaces 481 and 482. Moreover, $N_2$ gas flowing from the separation space H toward the spaces 481 and 482 functions as a counter flow against the first reaction gas from the gas first process region P1 and the second reaction gas from the second process region P2. Thus, the first reaction gas from the first process region P1 is separated from the second reaction gas from the second process region P2 by the separation space H. Therefore, mixing and reacting of the first reaction gas with the second reaction gas are prevented in the vacuum chamber 1.

The height h1 of the low ceiling surface 44 above an upper surface of the turntable 2 is preferred to be appropriately determined based on the pressure of the vacuum chamber 1 during the film deposition, the rotational speed of the turntable 2, and a supplying amount of the separation gas (Ar gas) in order to maintain the pressure in the separation space H higher than those in the spaces 481 and 482.

Referring to FIGS. 1 through 3, the ceiling plate 11 further includes the protruding portion 5 at its lower surface to surround the outer periphery of the core unit 21 which fixes the turntable 2. The protruding portion 5 is continuously formed with the inner portions of the convex portions 4 and has a lower surface which is formed at the same height as those of the low ceiling surfaces 44, in this embodiment.

Figure 5:
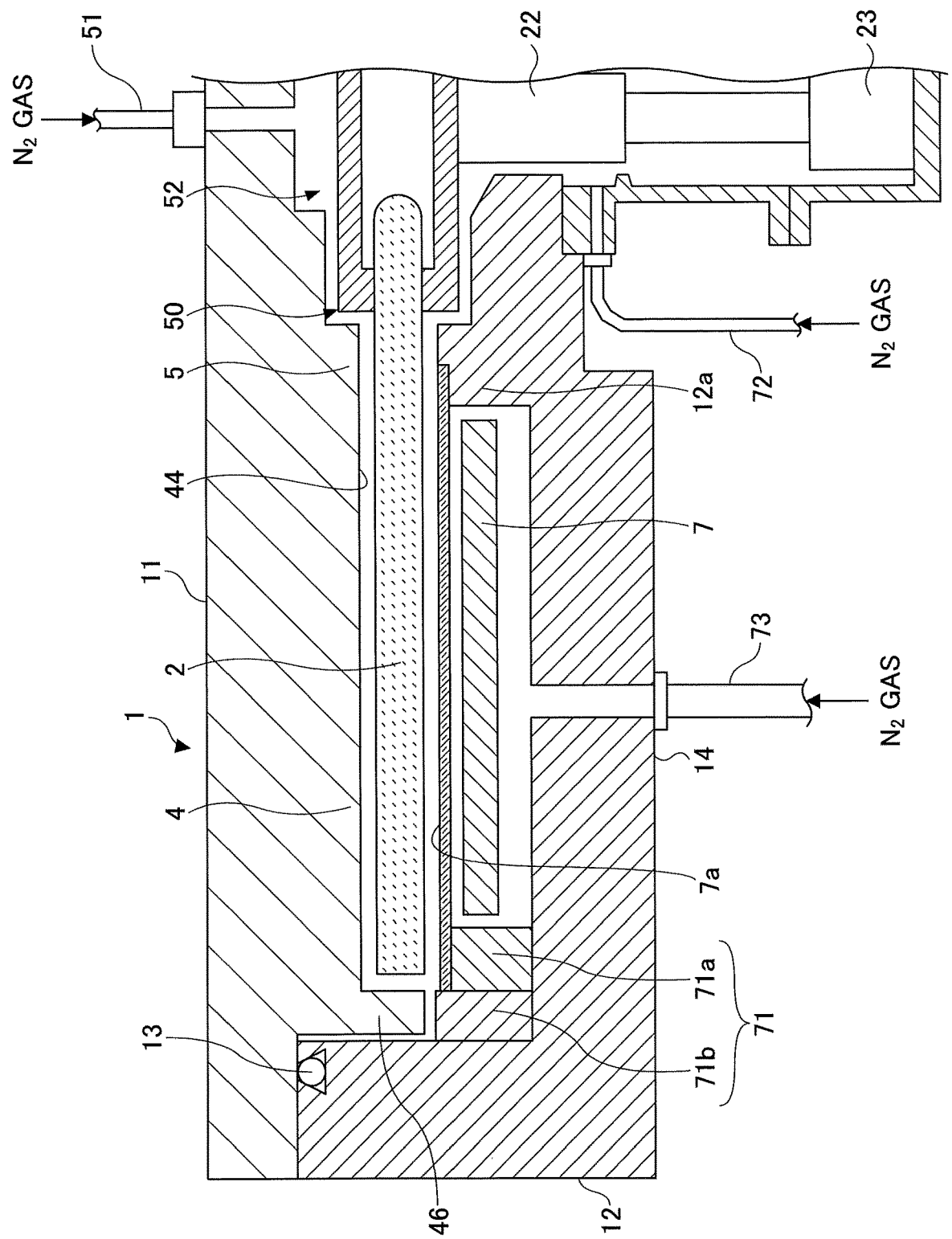
FIG. 5 is another schematic cross-sectional view of a film deposition apparatus according to an embodiment of the present disclosure.

FIG. 5 is a partial cross-sectional view illustrating an area where the ceiling surface 44 is provided. As illustrated in FIG. 5, the convex portion 4 having a substantially fan-like top view shape includes an outer bending portion 46 at its outer peripheral end portion (at an outer peripheral end portion side of the vacuum chamber 1) which is bent to have an L-shape to face an outer end surface of the turntable 2. The outer bending portion 46 inhibits a flow of gas between the space 481 and the space 482 through the space between the turntable 2 and the inner peripheral surface of the chamber body 12. As described above, the convex portions 4 are provided on the ceiling plate 11 which is detachably attached to the chamber body 12. Thus, there is a slight space between the outer periphery surface of the outer bending portion 46 and the chamber body 12. The spaces between the inner periphery surface of the outer bending portion 46 and an outer surface of the turntable 2, and the space between the outer periphery surface of the outer bending portion 46 and the chamber body 12 are set at the same size as the height h1 (see FIG. 4) of the low ceiling surface 44 with respect to the upper surface of the turntable 2, for example.

As illustrated in FIG. 5, the inner peripheral wall of the chamber body 12 is provided to extend in a vertical direction to be closer to the outer peripheral surface of the outer bending portion 46 at the separation area H. However, other than the separation area H, as illustrated in FIG. 1, for example, the inner peripheral wall of the chamber body 12 is formed to have a concave portion recessed outward from a location facing the outer end surface of the turntable 2 to the upper end of the bottom portion 14. Hereinafter, for an explanatory purpose, the concave portion, having a substantially rectangular cross-sectional view, is referred to as an "evacuation region". Specifically, a part of the evacuation region which is in communication with the first process region P1 is referred to as a first evacuation region E1, and a part of the evacuation region which is in communication with the second and third process region P2 is referred to as a second evacuation region E2. As illustrated in FIGS. 1 through 3, a first evacuation port 610 and a second evacuation port 620 are respectively provided at the bottom portions of the first evacuation region E1 and the second evacuation region E2. The first evacuation port 610 and the second evacuation port 620 are connected to vacuum pumps 640, which are vacuum evacuation units, via evacuation pipes 630, respectively, as illustrated in FIG. 1. Moreover, automatic pressure controllers (APC) 650 that are pressure adjustment units are provided in the evacuation pipes 630 between the vacuum pump 640 and the first exhaust opening 610 and between the vacuum pump 640 and the second exhaust opening 620, respectively. Thus, the exhaust pressures of the first exhaust opening 610 and the second exhaust opening 620 are configured to be controllable independently of each other.

The heater unit 7 is provided at a space between the turntable 2 and the bottom portion 14 of the vacuum chamber 1 as illustrated in FIG. 1 and FIG. 5. The wafers W mounted on the turntable 2 are heated by the heater unit 7 via the turntable 2 to a temperature (450° C., for example) determined by a process recipe. A ring cover member 71 is provided at a lower portion side of the outer periphery of the turntable 2 in order to prevent gasses from being introduced into the space below the turntable 2. The cover member 71 includes an inner member 71a provided under the periphery and outside of the turntable 2 and an outer member 71b provided between the inner member 71a and the inner side wall of the vacuum chamber 1. The outer member 71b is provided to face the outer bending portion 46, which is formed at an outer edge portion at lower side of each of the convex portions 4. The inner member 71a is provided to surround the entirety of the heater unit 7 below the outer end portion (and at a slightly outer side of the outer edge portion) of the turntable 2.

The bottom portion 14 of the vacuum chamber 1 closer to the rotation center than the space where the heater unit 7 is provided protrudes upward to be close to the core unit 21 to form a projecting portion 12a. There is provided a narrow space between the projecting portion 12a and the core unit 21. Furthermore, there is provided a narrow space between an inner peripheral surface of the bottom portion 14 and the rotary shaft 22 to be in communication with the case body 20. A purge gas supplying pipe 72 which supplies $N_2$ gas as the purge gas to the narrow space for purging is provided in the case body 20. The bottom portion 14 of the vacuum chamber 1 includes a plurality of purge gas supplying pipes 73 (only one of the purge gas supplying pipes 73 is illustrated in FIG. 5) which are provided at a predetermined angle interval in the circumferential direction below the heater unit 7 for purging the space where the heater unit 7 is provided. Moreover, a cover member 7a is provided between the heater unit 7 and the turntable 2 to prevent the gas from going into the space where the heater unit 7 is provided. The cover member 7a is provided to extend from an inner peripheral wall (upper surface of the inner member 71a) of the outer member 71b to an upper end portion of the projecting portion 12a in the circumferential direction. The cover member 7a may be made of quartz, for example.

The film deposition apparatus 1 further includes a separation gas supplying pipe 51 that is connected to a center portion of the ceiling plate 11 of the vacuum chamber 1 and provided to supply Ar gas as the separation gas to a space 52 between the ceiling plate 11 and the core unit 21. The separation gas supplied to the space 52 flows through a narrow space between the protruding portion 5 and the turntable 2 so as to flow along the top surface of the turntable 2 where the wafers W are to be placed and is discharged toward the outer periphery. The space 50 is kept at a pressure higher than those of the space 481 and the space 482 by the separation gas. Thus, the mixing of a Si-containing gas supplied to the first process region P1 and an oxidation gas supplied to the second process region P2 by flowing through the center area C can be prevented by the space 50. It means that the space 50 (or the center region C) can function similarly to the separation space H (or the separation region D).

As illustrated in FIGS. 2 and 3, a transfer port 15 is formed in a side wall of the vacuum chamber 1 for allowing the wafers W, which are substrates, to pass between an external transfer arm 10 and the turntable 2. The transfer port 15 is opened and closed by a gate valve (not illustrated in the drawings). Furthermore, lift pins, which penetrate through the concave portion 24 to lift up the wafer W from a backside surface, and a lifting mechanism for the lift pins (both are not illustrated in the drawings) are provided at a location where the wafer W is transferred and below the turntable 2 because the wafer W is transferred between the external transfer arm 10 and the concave portion 24 of the turntable 2, which is a substrate receiving area, at a location facing the transfer port 15.

As illustrated in FIG. 1, the film deposition apparatus according to the present embodiment further includes a controller 100 that controls the entirety of the film deposition apparatus. The controller 100 may be a computer. A memory inside the controller 100 stores a program by which the film deposition apparatus executes the film deposition method (as will be explained later) under a control of the controller 100. The program is formed to include steps capable of executing the film deposition method. The program is stored in a recording medium 102 such as a hard disk, a compact disk (CD), a magneto-optic disk, a memory card, a flexible disk, or the like. The program is read into a memory unit 101 using a predetermined reading device and installed in the memory inside the controller 100.

The controller 100 also controls the valves, the flow controller 122 to 125 and the like that are connected to the source gas supply parts 32 to 34 and the cleaning gas supply part 35 of the showerhead 30 to perform a film deposition method according to the present embodiment that will be described below.

Next, the configuration of the showerhead 30 including the bottom plate 31 in the film deposition apparatus according to an embodiment of the present disclosure is described below.

Figure 6:
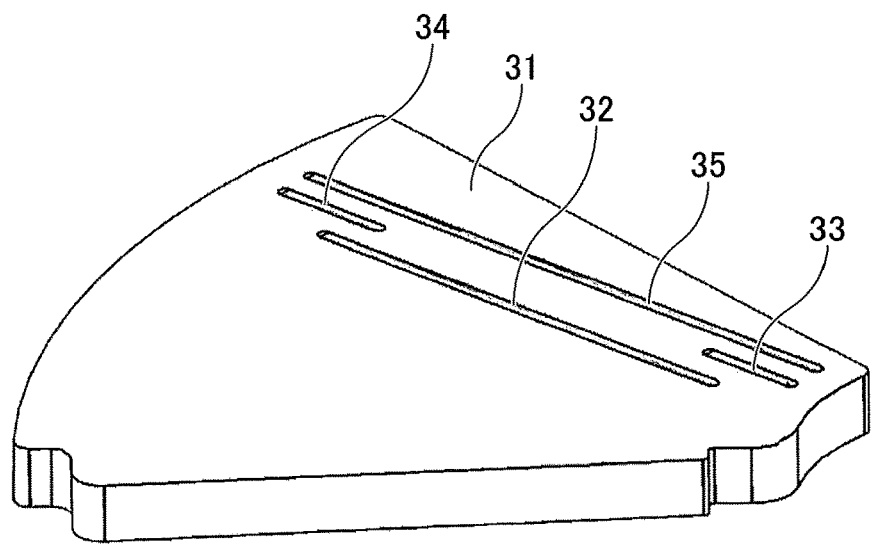
FIG. 6 is a diagram illustrating an example of a configuration of a lower surface of a bottom plate of a showerhead in a film deposition apparatus according to an embodiment of the present disclosure.

FIG. 6 is a diagram illustrating an example of the configuration of a bottom surface (lower surface) of the bottom plate 31 of the showerhead 30. As illustrated in FIG. 6, the low bottom surface region 31a and the high bottom surface region 31b are formed in the lower surface of the bottom plate 31. The main source gas supply part 32, the axial-side source gas supply part 33, the peripheral-side source gas supply part 34 and the cleaning gas supply part 35 are formed in the lower surface of the bottom plate 31.

The main source gas supply part 32, the axial-side source gas supply part 33 and the peripheral-side source gas supply part 34 are all provided upstream of the center of a bilaterally symmetric fan-like shape in the rotational direction of the turntable 2. This ensures an enough distance and time until a source gas reaches and adsorbs on the surface of the wafer W since the source gas is supplied toward the surface of the wafer W, thereby achieving favorable efficiency. Hence, the source gas supply parts 32 to 34 are preferably disposed upstream of the first process region P1. Here, the axial-side source gas supply part 33 and the peripheral-side source gas supply part 34 are provided in the vicinity of the main source gas supply part 32 so that the axial-side source gas supply part 33 and the peripheral-side source gas supply part 34 can adjust the concentration of the source gas supplied from the main source gas supply part 32.

A cleaning gas supply part 35 is provided upstream of the main source gas supply part 32. The cleaning gas supply part 35 is a gas supply unit to supply a cleaning gas used in cleaning the vacuum chamber 1, and is used in performing maintenance. The cleaning gas supply part 35 cleans not only the turntable 2 but also the bottom plate 31 of the showerhead 30. Because the bottom plate 31 also includes the source gas supply parts 32 to 34 and because the source gas supply parts 32 to 34 are obviously preferred to be cleaned in the cleaning, the cleaning gas supply part 35 is preferably supplied disposed upstream of the source gas supply parts 32 to 34. Here, the upstream means that the upstream in the rotational direction of the turntable 2 and the upstream of the exhaust opening 610 to evacuate the vacuum chamber 1 during the dry cleaning. In other words, the dry cleaning is performed while evacuating the vacuum chamber 1 from the exhaust opening 610 by the vacuum pump 640 and rotating the turntable 2. Because the cleaning gas flows toward the exhaust opening 610, by disposing the cleaning gas supply part 35 upstream in the evacuating direction of the cleaning gas, the cleaning can be performed in a broad range. Hence, the cleaning gas supply part 35 is preferred to be disposed upstream in the evacuating direction during the dry cleaning, and is further preferred to disposed upstream of the source gas supply parts 32 to 34. In addition, the upstream in the evacuating direction coincides with the upstream in the rotational direction of the turntable 2.

As discussed above, because the source gas supply parts 32 to 34 are preferably disposed upstream in the first process region P1 in the rotational direction of the turntable 2, and because the cleaning gas supply part 35 is preferably disposed upstream of the source gas supply parts 32 to 34 in the evacuating direction, which means that the source gas supply parts 32 to 34 are preferably disposed upstream in the rotational direction of the turntable 2, the cleaning gas supply part 35 is disposed in a narrow region between an upstream end in the first process region P1 and the source gas supply parts 32 to 34. Hence, the cleaning gas supply part 35 is disposed in the vicinity of the source gas supply parts 32 to 34. In FIG. 6, the cleaning gas supply part 35 is disposed adjacent to the source gas supply parts 32 to 34 and approximately parallel to the source gas supply parts 32 to 34. In such an arrangement, when the cleaning gas supply part 35 supplies a purge gas such as nitrogen during the film deposition, the supplied purge gas is liable to negatively affect the source gas supply from the source gas supply parts 32 to 34. That is, nitrogen gas supplied from the upstream near position may negatively affect the source gas supplied from the source gas supply parts 32 to 34, thereby preventing uniform adsorption of the source gas on the wafer W, and decreasing the uniformity across the wafer W.

Hence, in the film deposition apparatus and the film deposition method according to the present embodiment, the cleaning gas supply part 35 does not supply the purge gas during the film deposition. Thus, the uniformity of the film deposition across the wafer W can be improved. Here, although the adsorption of the source gas in the cleaning gas supply part 35, which may cause a particle, is concerned, the purge gas is supplied into the cleaning gas supply part 35 at timing other than the film deposition, thereby preventing such generation of the particle. Details of such a film deposition method will be described later.

Figure 7:
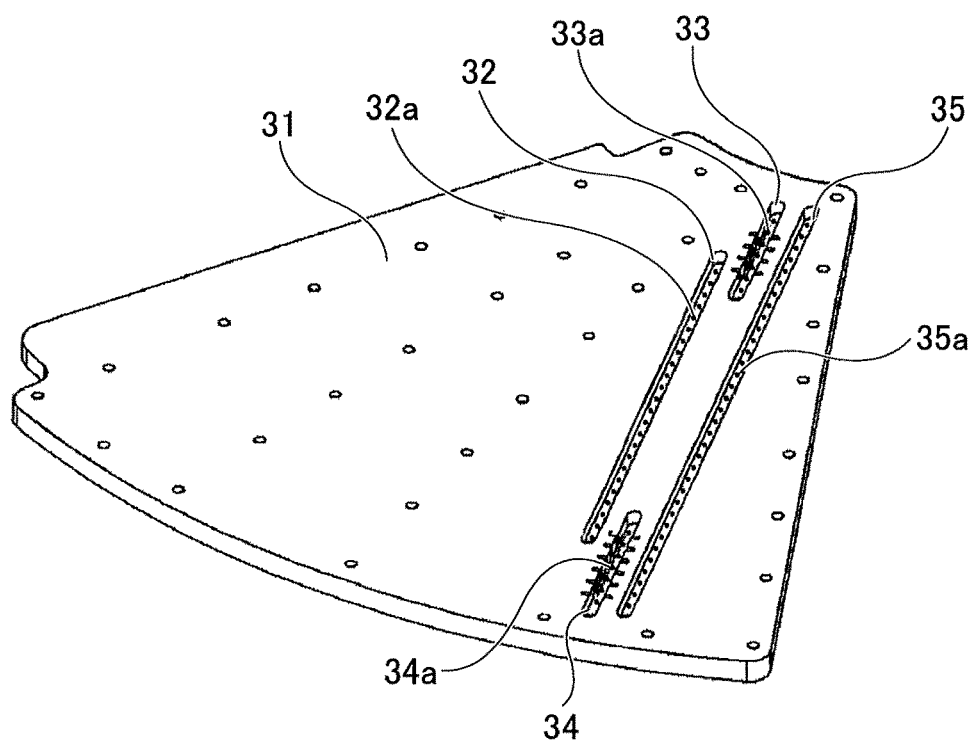
FIG. 7 is a diagram illustrating an example of a configuration of an upper surface of a bottom plate of a showerhead in a film deposition apparatus according to an embodiment of the present disclosure.

FIG. 7 is a diagram illustrating an example of a configuration of an upper surface of the bottom plate 31 of the showerhead 30. As illustrated in FIG. 7, the main source gas supply part 32, the axial-side source gas supply part 33, the peripheral-side source gas supply part 34 and the cleaning gas supply part 35 are provided at locations corresponding to the locations illustrated in FIG. 6, respectively. Also, FIG. 7 illustrates gas discharge holes 32a provided in the bottom surface of the main source gas supply part 32, and the axial-side source gas supply part 33 has axial-side source gas discharge holes 33a in its bottom surface. Similarly, the peripheral-side source gas supply part 34 has peripheral-side source gas discharge holes 34a in its bottom surface. Furthermore, the cleaning gas supply part 35 has cleaning gas discharge holes 35a in its bottom surface.

The gas discharge holes 32a, 33a, 34a and 35a are linearly arranged in the bottom surfaces of the linearly formed gas supply parts 32, 33, 33, 34 and 35, respectively.

Figure 8:
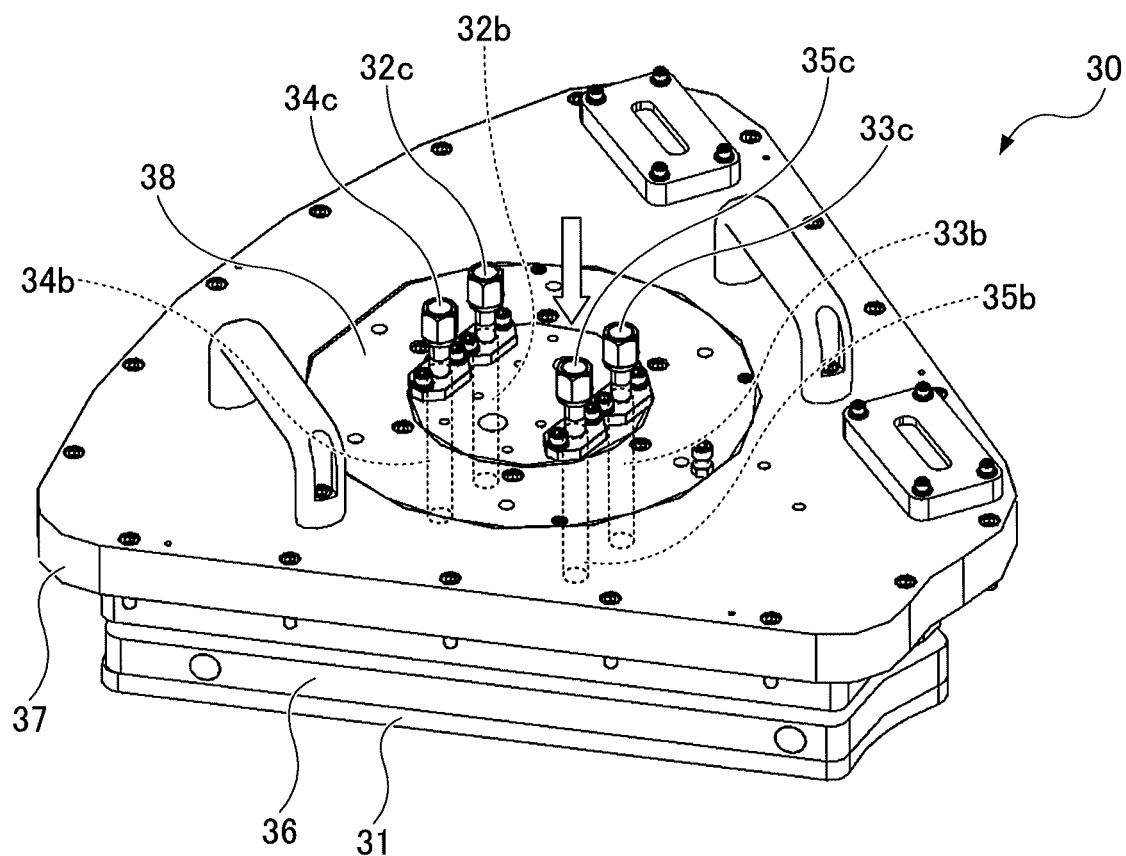
FIG. 8 is a diagram illustrating an example of an overall configuration of a showerhead in a film deposition apparatus according to an embodiment of the present disclosure.

FIG. 8 is a perspective view illustrating an example of an overall configuration of the showerhead 30. As illustrated in FIG. 8, the showerhead 30 includes the bottom plate 31, a middle stage part 36, an upper stage part 37, a central part 38, gas introduction passages 32b to 35b, and gas introduction parts 32c to 35c. The showerhead 30 including the bottom plate 31 may be made of a metal material such as aluminum.

The gas introduction parts 32c to 35c are inlets to introduce the source gas and the cleaning gas from the outside, and are configured as joints, for example. Four gas introduction parts 32 to 35c are provided corresponding to four gas introduction passages 32b to 35b, and are configured to be able to supply gases independently. Gas introduction passages 32b to 35b are formed under the gas introduction parts 32c to 35c, and are configured to be directly connectable with the source gas supply parts 32 to 35 and the cleaning gas supply part 35 described in FIG. 7.

The central part 38 includes the gas introduction parts 32c to 35c and the gas introduction passages 32b to 35b, and is configured to be rotatable. Thus, an angle of the showerhead 30 can be adjusted, and the positions of the main source gas supply part 32, the axial-side source gas supply part 33 and the peripheral-side source gas supply part 34 can be finely adjusted.

The upper stage part 37 serves as an upper frame, and is structured to be installable in the ceiling plate 11. The middle stage part 36 plays a role of connecting the upper stage part 37 with the bottom plate 31, and also serves as a supply passage of the cleaning gas because a cleaning gas supply passage of the cleaning gas supply part 35 is formed therein.

Thus, the showerhead 30 introduces the source gas and the cleaning gas from the upper surface of the ceiling plate 11 of the vacuum chamber 1.

Figure 9:
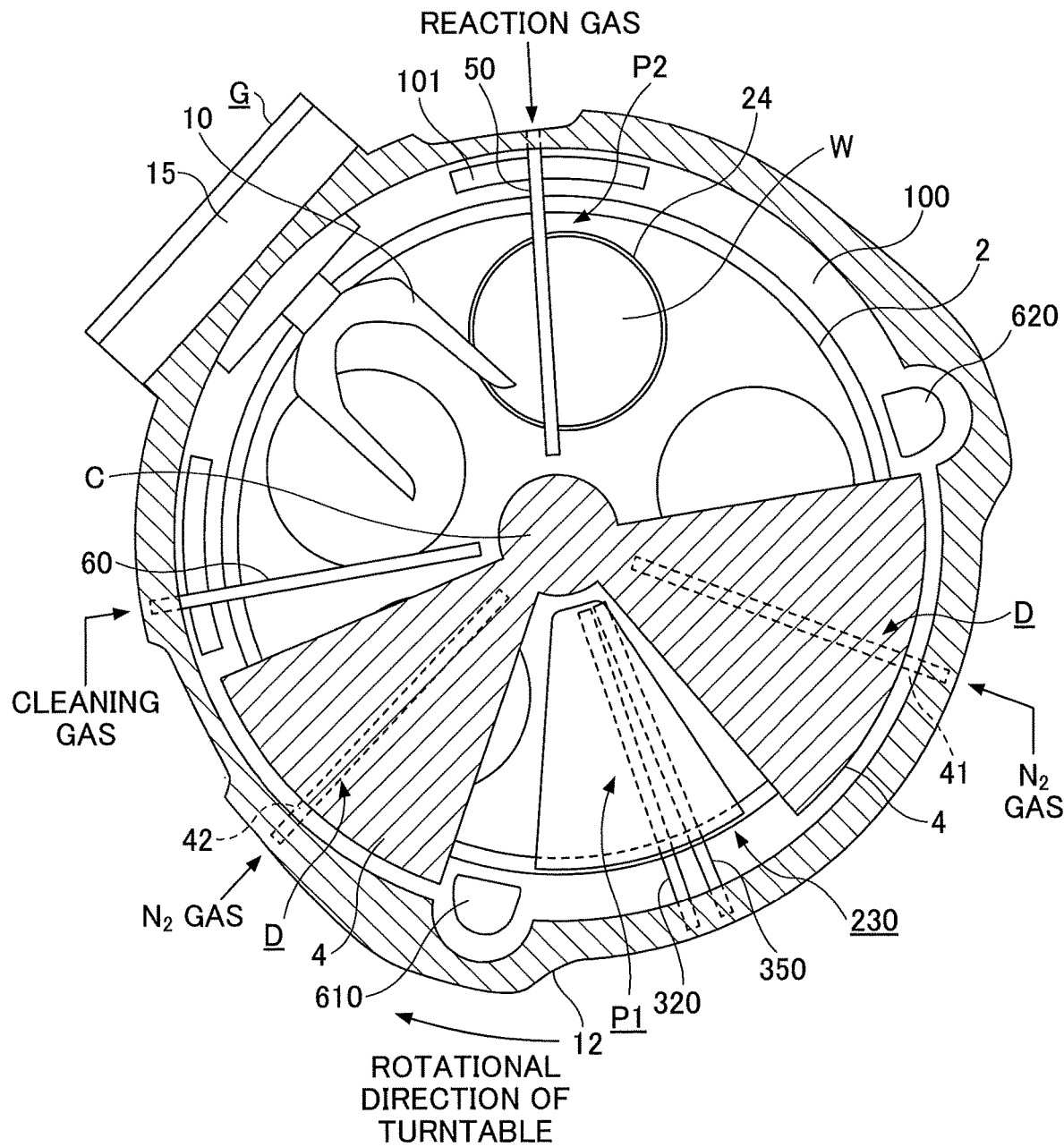
FIG. 9 is a plan view illustrating an embodiment when a source gas supply part and a cleaning gas supply part are configured as nozzles.
Figure 10:
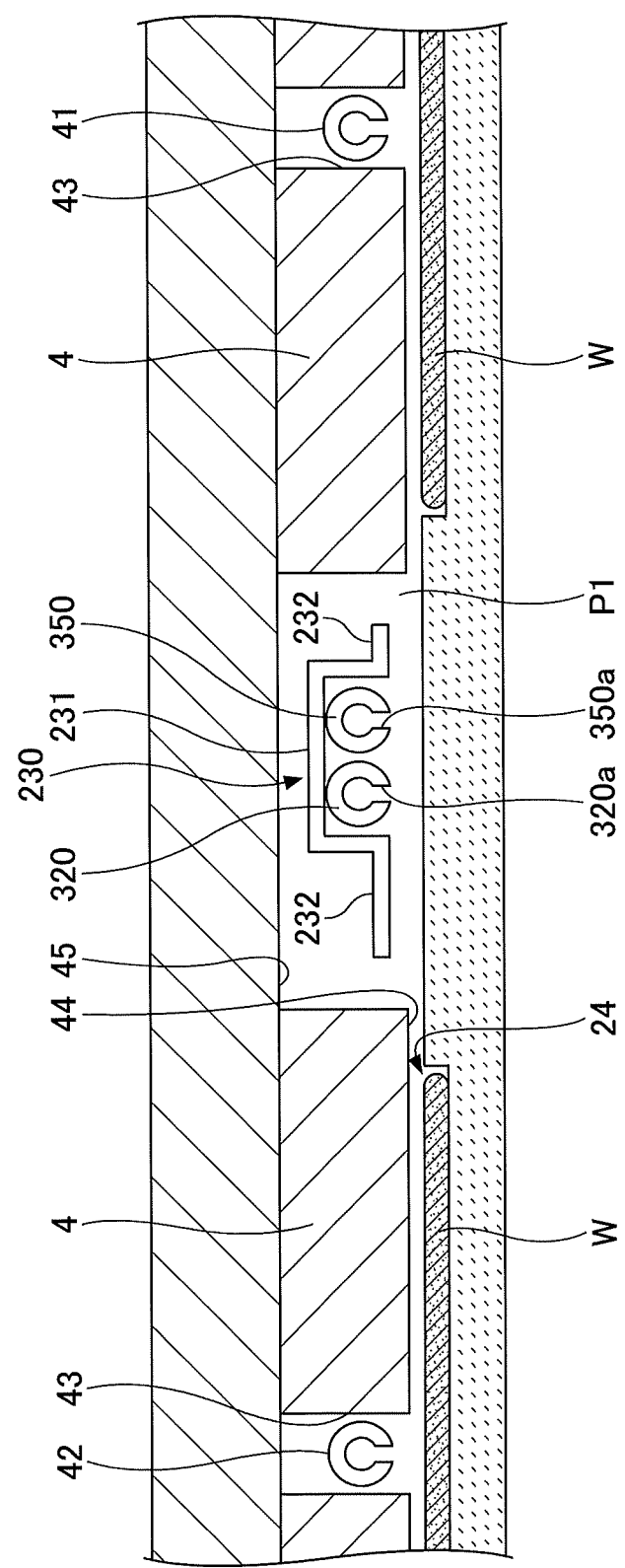
FIG. 10 is a cross-sectional view illustrating an embodiment when a source gas supply part and a cleaning gas supply part are configured as nozzles.

FIG. 9 is a plan view illustrating an embodiment when a source gas supply part and a cleaning gas supply part are configured as nozzles. FIG. 10 is a cross-sectional view of an embodiment when the source gas supply unit and the cleaning gas supply unit are configured as nozzles.

In FIG. 9, a source gas nozzle 320 and a cleaning gas nozzle 350 are disposed in the first process region P1. A nozzle cover 230 is disposed above the source gas nozzle 320 and the cleaning gas nozzle 350 to circulate the source gas along the wafer W and to cause the separation gas to flow through a space close to the ceiling plate 11 of the vacuum chamber 1 while flowing around a location in the vicinity of the wafer W.

As illustrated in FIG. 10, the nozzle cover 230 includes an approximately-box-shaped cover body 231 having an opening in the lower side to accommodate the source gas nozzle 230 and the cleaning gas nozzle 350, and current plates 232 connected to the upstream and downstream edges of the opening of the cover body 231 in the rotational direction of the turntable 2. A side wall of the cover body 231 near the rotational center of the turntable 2 extends toward the turntable 2 to face a tip of the first process gas nozzle 31. Another side wall of the cover 231 near the outer edge of the turntable 2 is partially cut off so as not to interfere with the source gas nozzle 230 and the cleaning gas nozzle 350.

Thus, the source gas nozzle 230 and the cleaning gas nozzle 350 may be used instead of the showerhead 30. Even in this case, the cleaning gas nozzle 350 is preferably disposed adjacent and close to the source gas nozzle 230 upstream of the source gas nozzle 230 in the evacuating direction in terms of efficiently cleaning the lower surfaces of the nozzle cover 230 (particularly, the lower surfaces of the current plates 232) and the source gas nozzle 320. In such an arrangement, because supplying purge gas from the cleaning gas nozzle 350 during the film deposition may negatively affect the uniformity of the film deposition across the wafer W, the film deposition apparatus and the film deposition method according to the present embodiment can be preferably applied.

[Film Deposition Method]

Next, a film deposition method according to an embodiment of the present disclosure is described below by citing an example of using the above-mentioned film deposition apparatus. Although the film deposition method according to the present embodiment can be applied to processes of depositing a variety of thin films without respect to types of the source gas and the reaction gas, an example of supplying an Si-containing gas as a source gas and supplying an oxidation gas as a reaction gas is described below for convenience of explanation.

To begin with, to carry substrates such as the wafers W into the vacuum chamber 1, the gate valve G is opened. Next, while the turntable 2 is being rotated intermittently, the wafers W are carried into the vacuum chamber 1 through the transfer opening 15 and placed on the turntable 2 by the transfer arm 10.

Next, the gate valve G is closed, and the pressure in the vacuum chamber 1 is adjusted to a predetermined pressure value by the vacuum pump 64 and the pressure controller 65. Then, the wafers W are heated to a predetermined temperature by the heater unit 7 while the turntable 2 is rotated. At this time, a separation gas, for example, $N_2$ gas is supplied from the separation gas nozzles 41 and 42. Such an adjustment of film deposition conditions in the vacuum chamber 1 is referred to as a pre deposition treatment process.

Next, the source gas supply parts 32 to 34 of the showerhead 30 and the reaction gas nozzle 50 discharge a Si-containing gas and an oxidation gas, respectively (see FIG. 2 and FIG. 3). On this occasion, the cleaning gas supply part 35 of the showerhead 30 does not supply any gas including the purge gas. Thus, nothing affects the flow of the source gas from the source gas supply parts 32 to 34, thereby uniformly adsorbing the source gas on the surface of the wafer W.

While the turntable 2 rotates one revolution, the Si-containing gas adsorbs on the surface of the wafer W in the first process region P1, and then the oxidation gas oxidizes the Si-containing gas adsorbed on the surface of the wafer W in the second process region P2. Thus, one or more molecular layers of silicon oxide film that is a component of the thin film are formed, which means a reaction product is formed, and the silicon oxide film is deposited on the surface of the wafer W.

At this time, the cleaning gas nozzle 60 in the second process region P2 does not have to supply any gas including the purge gas, or may supply a slight amount of purge gas. The gas supplied from the reaction gas nozzle 50 in the second process region P2 is the oxidation gas, is supplied at a flow rate that is much greater than that of the source gas, and is unlikely to be affected by a gas flow in the surrounding space because the oxidation gas does not adsorb on the wafer W like the Si-containing gas. Hence, whether the cleaning gas nozzle 60 supplies the purge gas in the second process region P2 may be determined depending on the process and the intended use.

In the present embodiment, by continuing to rotate the turntable 2, the adsorption of the source gas on the surface of the wafer W, the oxidation of a component of the source gas adsorbed on the surface of the wafer W are performed many times in this order. In other words, the film deposition process by ALD is performed by rotating the turntable 2.

Here, the separation region D is disposed between the second process region P2 and the third process region P3 along the circumferential direction of the turntable 2 in the film deposition apparatus of the present embodiment. Thus, each gas is evacuated toward the exhaust opening 610 and 620 while preventing the Si-containing gas and the oxidation gas from mixing with each other in the separation region D. The evacuating direction is the same as the rotational direction of the turntable 2 as discussed above.

When the thin film deposited by the deposition process reaches a predetermined film thickness, the supply of the Si-containing gas from the source gas supply parts 32 to 34 is stopped. Subsequently, in order to oxidizing the thin film sufficiently, the pre-deposition treatment process that continues to rotate the turntable 2 while the reaction gas nozzle 50 supplies the oxidation gas. Thus, the unreacted Si-containing gas reacts with the oxidation gas, and the silicon oxide film becomes dense, thereby improving the film quality. Then, the supply of the oxidation gas is also stopped while stopping the supply of the purge gas ($N_2$), and the rotation of the turntable 2 is stopped. The conditions including the temperature, the pressure and the like may be returned to the original conditions. Such a process after the film deposition is referred to as the pre-deposition treatment process.

Subsequently, a carry-out process is performed, and the wafers W are carried out of the vacuum chamber 1. With respect to the carry-out process, the plurality of wafers W is sequentially carried out of the vacuum chamber 1 until all of the wafers W are carried out of the vacuum chamber 1, and then new wafers W may be carried into the vacuum chamber 1. In contrast, one of the wafers W may be carried out of the vacuum chamber and then a new single wafer W is carried into the vacuum chamber 1 so as to replace the processed wafer W with a new wafer W in a one-to-one manner so that a new wafer W is carried into an empty concave portion 24 after the processed wafer W is removed from the concave portion 24. In the case of replacement transfer, the carry-in process of the subsequent wafer W and the carry-out process of the processed wafer W are performed at the same time.

Thus, the film deposition process is constituted of the substrate carry-in process, the pre-deposition treatment process, the deposition process, the post-deposition treatment process, and the substrate carry-out process (including the substrate replacement process). Among the processes, the deposition process includes a process of supplying the source gas to the wafer W, and the other processes do not include the process of supplying the source gas to the wafer W. Hence, in the processes other than the deposition process, it is possible to supply the purge gas from the cleaning gas supply part 35 and to purge the cleaning gas line. In other words, in the film deposition method according to the present embodiment, the deposition process includes a source gas adsorption process of supplying and adsorbing the source gas onto the wafer W without supplying a purge gas from the cleaning gas supply part 35, and a reaction process of supplying a reaction gas to the wafer W and depositing a reaction product of the source gas adsorbed on the surface of the wafer W and the reaction gas without supplying a purge gas from the cleaning gas supply part 35. Thus, the uniformity of the film deposition process across the surface of the wafer W can be improved.

As necessary, part or all of the processes of the substrate carry-in process, the pre-deposition treatment process, the post-deposition treatment process, the substrate carry-out process (including the substrate replacement process) other than the film deposition process may include the process of supplying the purge gas (e.g., $N_2$) from the cleaning gas supply part 35. Thus, the cleaning line can be purged without negatively affecting the film deposition process, and the particles caused by the adsorption of the source gas can be reduced.

A specific sequence of the film deposition method according to the present embodiment is described below. Here, gases to be supplied are described while being generalized.

FIG. 11 is a first sequence of the film deposition method according to the first embodiment. FIG. 11 illustrates a relationship between sequence step numbers and specific processes.

To begin with, in step S1, a substrate carry-in process is performed. More specifically, multiple wafers W are carried into the vacuum chamber 1, and are each placed on the concave portions 24.

In step S2, the pre-deposition treatment process is performed. More specifically, the pressure and the temperature in the vacuum chamber 1 are adjusted in accordance with the film deposition conditions, and the separation gas (purge gas) is supplied into the vacuum chamber 1. Moreover, the turntable 2 begins to rotate.

In the substrate carry-in process and the pre-deposition treatment process of steps S1 and S2, the cleaning gas supply part 35 supplies the purge gas, and the purge gas line can be purged. Hence, as necessary, the purge gas line may be purged.

In step S3, the deposition process is performed. More specifically, the source gas supply parts 32 to 34 supply the source gas, and the reaction gas supply part 50 supplies the reaction gas (oxidation gas or nitriding gas) without supplying any gas including the purge gas from the cleaning gas supply part 35 while continuing to rotate the turntable 2. Thus, adsorption of the source gas on the wafer W, and oxidation or nitriding of the adsorbed source gas are performed, thereby depositing molecular layers of the reaction product. In supplying the source gas, because the cleaning gas supply part 35 does not supply any gas including the purge gas, the adsorption of the source gas is not affected by the other gases, and uniformly adsorbs on the surface of the wafer W. Thus, the uniformity of the film deposition process improves. Here, the cleaning gas nozzle 60 may supply the purge gas as necessary. The deposition process of step S23 is repeated until the film thickness reaches the predetermined thickness. When the film thickness reaches the predetermined film thickness, the film deposition process is completed.

In step S4, the post-deposition treatment process is performed. In the pre-deposition treatment process, the supply of the source gas is stopped while the supply of the reaction gas and separation gas is continued. Otherwise, the turntable 2 is continuously rotated while supplying only the separation gas without supplying the reaction gas. Then, the rotation of the turntable 2 is stopped, and a state of the vacuum chamber 1 is changed by changing the conditions such as the pressure as necessary. At this state, because the supply of the source gas is stopped, and because the cleaning gas line can be purged, the cleaning gas supply part 35 supplies the purge gas as necessary.

In step S5, the substrate replacement process is performed. More specifically, the wafer W on which the film is deposited is carried out of the vacuum chamber 1, and a new wafer W is placed on the empty concave portion 24 from which the wafer W is removed. In other words, the carry-in and carry-out of the wafer W is sequentially performed for each wafer W (each concave portion 24). Even in the substrate replacement process, because the cleaning line can be purged, the cleaning gas supply part 35 supplies the purge gas as necessary.

From step S6, the pre-deposition process is performed similar to step S2. Because the process is the same as that of step S2, the description is omitted. Even in the pre-deposition treatment process, because the cleaning gas line can be purged, the cleaning gas supply part 35 supplies the purge gas as necessary. Thus, the cleaning line can be continuously purged from the post-deposition treatment process of step S4 to the post-deposition treatment process of step S6. The purge can be also performed at part of the processes from steps S4 to S6.

Furthermore, the cleaning gas line can be purged for only a partial period of the part of the processes. Thus, the cleaning gas line can be purged in any period other than the deposition process.

The deposition process, the post-deposition treatment process and the substrate replacement process are repeated from steps S7 to step S9 similar to steps S3 to S5. Similar repetitions are performed hereinafter.

In step Sn, the wafer W is carried out. At this time, all of the wafers W are sequentially carried out of the vacuum chamber 1 without replacing the wafer W. After all of the wafers W are carried out, the dry cleaning is performed. More specifically, the cleaning gas nozzle 35 and the cleaning gas nozzle 60 supply a cleaning gas such as $ClF_3$, and remove the source gas and the reaction product attached to the turntable 2 and the showerhead 30 by etching.

After the dry cleaning finishes, the sequence is repeated from step S1 again. Thus, according to the first sequence of the film deposition method according to the present embodiment, the cleaning gas supply part 35 can be purged in a variety of processes other than the deposition process, and the uniformity of the film deposition process across the surface of the wafer W can be improved, and the generation of the particles can be reliably prevented.

FIG. 12 is a diagram illustrating a second sequence of the film deposition method according to the present embodiment. A display format is the same as that of FIG. 12.

Because a carry-in process of step S1 to a post-deposition treatment process of step S4 are the same as steps S1 to S4 of FIG. 11, the description is omitted. Here, the second sequence is the same as the first sequence in that the cleaning gas supply part 35 does not supply any gas during the deposition process.

However, in these steps S1 to S4, the second sequence differs from the first sequence in that purging the cleaning gas supply part 35 is not performed at all.

In step S5, a substrate carry-out process is performed. In the substrate carry-out process, all of the wafers W on which the film deposition has been performed are carried out of the vacuum chamber 1.

In step S6, a cleaning purge process is performed. More specifically, the cleaning gas supply part 35 supplies the purge gas, thereby purging the cleaning gas line. On this occasion, the cleaning gas nozzle 60 may be purged at the same time.

Thus, in the second sequence, the cleaning gas line is purged when a wafer W is not present in the vacuum chamber 1. Because the purge is performed when any wafer W is not present in the vacuum chamber 1, dispersal of the particles on the wafer W can be completely prevented, and a more reliable purge can be performed.

In steps S7 to S12, the same sequence as that of steps S1 to S6 is repeated. Moreover, as necessary, the dry cleaning may be performed when the wafer W is not present in the vacuum chamber 1.

Thus, according to the second sequence of the film deposition method according to the present embodiment, uniformity of the film deposition process across the surface of the wafer W can be improved, and the cleaning gas line can be purged while completely eliminating concerns of the particles scattered on the wafer W.

Here, the cleaning gas supply part 35 of the showerhead 30 may be naturally replaced by the cleaning gas nozzle 350.

Moreover, in the present embodiment, an example of disposing the cleaning gas supply part 35 and the cleaning gas nozzle 350 upstream and in the vicinity of the source gas supply parts 32 to 34 and the source gas nozzle 320 is described, but the configuration is not necessary. When the purge gas supplied from the cleaning gas supply part 35 and the cleaning gas nozzle 350 during the film deposition negatively affects the uniformity of the film deposition across the surface of the wafer, the present disclosure can be applied a variety of configurations. In other words, the present disclosure can be applied even when the cleaning gas supply part 35 and the cleaning gas nozzle 350 are apart from the source gas supply parts 32 to 34 and the source gas nozzle 320 or disposed downstream of the source gas supply parts 32 to 34 and the source gas nozzle 320. This is because the supply of the purge gas from the cleaning gas supply part can negatively affect the film deposition in any configuration.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present disclosure have been described in detail, it should be understood that various changes, substitutions, and alterations could be made hereto without departing from the spirit and scope of the invention.

What is claimed is:

1. A film deposition method using a film deposition apparatus including a source gas nozzle and a cleaning gas nozzle, the method comprising:

carrying a substrate into a process chamber of the film deposition apparatus;

adjusting a film deposition condition including a pressure and a temperature of the process chamber, adsorbing a source gas on a substrate by supplying the source gas from the source gas nozzle without supplying a purge gas into the cleaning gas nozzle; and depositing a reaction product on the substrate by supplying a reaction gas reactable with the source gas to the substrate on which the source gas is adsorbed without supplying the purge gas into the cleaning gas nozzle;

repeating the steps of adsorbing the source gas on the substrate and depositing the reaction product on the substrate until the reaction product reaches a predetermined thickness;

adjusting a condition in the vacuum chamber by stopping supply of the source gas, carrying the substrate out of the process chamber, applying the steps of carrying the substrate into the process chamber, adjusting the film deposition condition, adsorbing a source gas on the substrate, depositing a reaction product on the substrate, adjusting the condition in the vacuum chamber, and carrying the substrate out of the process chamber to a new substrate; and purging the cleaning gas nozzle by supplying an inert gas into the cleaning gas nozzle for partial or all period of time of the steps of carrying the substrate into the process chamber, adjusting the film deposition condition, adjusting the condition in the vacuum chamber, and carrying the substrate out of the process chamber other than the step of repeating the steps of adsorbing the source gas on the substrate and depositing the reaction product on the substrate while periodically repeating the steps of carrying the substrate into the process chamber, adjusting the film deposition condition, repeating the step of repeating the steps of adsorbing the source gas on the substrate and depositing the reaction product on the substrate, adjusting the condition in the vacuum chamber, and carrying the substrate out of the process chamber for the substrate and the new substrate, wherein the method further comprises performing a dry cleaning of the process chamber by the cleaning gas nozzle in a state where all of substrates are removed from the process chamber after the periodically repeating the steps, wherein the purging the cleaning gas nozzle is not simultaneously performed with the dry cleaning, and wherein the source gas nozzle and the cleaning gas nozzle are provided in a bottom plate of a one showerhead that has a fan shape.

2. The film deposition method according to claim 1, wherein the step of purging the cleaning gas nozzle by supplying the purge gas into the cleaning gas nozzle for partial or all period of time of the steps of carrying the substrate into the process chamber, adjusting the film deposition condition, adjusting the condition in the vacuum chamber, and carrying the substrate out of the process chamber other than the step of repeating the steps of adsorbing the source gas on the substrate and depositing the reaction product on the substrate while periodically repeating the steps of carrying the substrate into the process chamber, adjusting the film deposition condition, repeating the step of repeating the steps of adsorbing the source gas on the substrate and depositing the reaction product on the substrate, adjusting the condition in the vacuum chamber, and carrying the substrate out of the process chamber, is performed upon detecting that the substrate is not present in the process between the steps of carrying the substrate into the process chamber and carrying the substrate out of the process chamber.

3. The film deposition method according to claim 1, wherein the process chamber accommodate a plurality of substrates, and wherein the steps of carrying the substrate into the process chamber and carrying the substrate out of the process chamber include a step of replacing a substrate by carrying a single substrate among, the plurality of substrates out of the process chamber and then carrying a new substrate into a location where the single substrate is placed before being carried out of the process chamber.

4. The film deposition method according to claim 1, wherein the cleaning gas nozzle is disposed parallel to the source gas nozzle.

5. The film deposition method according to claim 1, wherein the cleaning gas nozzle is disposed upstream of the source gas nozzle in an evacuating direction formed by evacuation from an exhaust opening provided in the process chamber.

6. The film deposition method according to claim 5, wherein the source gas nozzle is provided on an upstream side relative to a center of the fan-like shape in a rotational direction of a turntable.

7. The film deposition method according to claim 1,
wherein the process chamber includes a turntable having substrate receiving regions arranged in a circumferential direction of the turntable to receive a plurality of substrates thereon, and wherein the process chamber includes a source gas adsorption region and a reaction product deposition region apart from each other along the circumferential direction of the turntable and above the turntable, wherein the step of adsorbing the source gas on the substrate is performed when the plurality of substrates passes the source gas adsorption region by rotating the turntable, and wherein the step of depositing the reaction product on the substrate is performed when the plurality of substrates passes the reaction product deposition region by rotating the turntable.

8. The film deposition method according to claim 7, wherein each of the source gas nozzle and the cleaning gas nozzle has a linear shape extending along a redial direction of the turntable, and is disposed substantially parallel to each other in the source gas adsorption region.

9. A film deposition method according to claim 8, wherein the source gas nozzle and the cleaning gas nozzle are disposed in a bottom surface of a showerhead.

10. The film deposition method according to claim 8, wherein the source gas nozzle and the cleaning gas nozzle are gas nozzles independent of each other and covered with current plates disposed parallel to the turntable.

11. The film deposition method according to claim 1, wherein the dry cleaning is performed by supplying a cleaning gas including at least one of $ClF_3$, $CF_4$, $C_2F_6$, $C_3F_8$, $CHF_3$, $NF_3$, or $F_2$ to the cleaning gas nozzle, and the purging the cleaning gas nozzle is performed by supplying the inert gas consisting of $N_2$ to the cleaning gas nozzle.

12. The film deposition method according to claim 1, wherein the method further comprises supplying a cleaning gas from the cleaning gas nozzle and another cleaning gas nozzle that is provided outside the showerhead.

* * * * *